US006314194B1

(12) United States Patent
Michael et al.

(10) Patent No.: US 6,314,194 B1
(45) Date of Patent: Nov. 6, 2001

(54) METHOD FOR GENERATING COMPUTER AIDED DESIGN PROGRAMMING CIRCUIT DESIGNS FROM SCANNED IMAGES OF THE DESIGN

(75) Inventors: Gerald T. Michael, Ocean, NJ (US); Wei Su, Staten Island, NY (US); Michael A. Dukes, New Egypt, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 1059 days.

(21) Appl. No.: 08/506,943

(22) Filed: Jul. 26, 1995

(51) Int. Cl.$^7$ ................................................... G06K 9/00
(52) U.S. Cl. ..................... 382/113; 250/559.34; 382/145; 700/121
(58) Field of Search ........................... 382/113, 145–149; 364/488, 489, 490, 491, 578, 736.5; 250/559.34; 700/121

(56) References Cited

U.S. PATENT DOCUMENTS

| | | | |
|---|---|---|---|
| 4,791,586 | * 12/1988 | Maeda et al. | 364/491 |
| 4,949,388 | * 8/1990 | Bhaskaran | 382/159 |
| 4,984,279 | * 1/1991 | Kidney et al. | 382/113 |
| 5,222,158 | 6/1993 | Takasaki et al. | 382/284 |
| 5,251,268 | * 10/1993 | Colley et al. | 382/156 |
| 5,325,441 | * 6/1994 | Hoecker | 382/113 |
| 5,467,411 | * 11/1995 | Tanaka et al. | 382/113 |
| 5,568,397 | * 10/1996 | Yamashita et al. | 364/488 |
| 5,572,437 | * 11/1996 | Rostoker et al. | 364/488 |

OTHER PUBLICATIONS

Pelz et al, "Circuit Comparison by Hierarchical Pattern Matching", Proceedings of 1991 Conference on Computer–Aided Design, Nov. 1991, pp. 290–193.
Shi et al, "A New Input Method for CAD–Automatic Read In Technique of Paper Drawings", Proceedings of 1991 International Conference on Circuits and Systems, Jun. 1991, pp 431–433.

Maderlecher et al, "Representation, Classification and Modelling of Graphs for Efficient Pattern Recognition in Line Images", Proceedings of the 9th International Conference on Pattern Recognition, Nov. 1988, vol. 2, pp. 678–680.
Yu et al, "A Knowledge–Based Graphic Description Tool for Understanding Engineering Drawings", Proceedings of the 1st International Conference on Systems Integration, Apr. 1990, pp. 302–309;.
Luenberger, Introduction to Dynamics Systems, pp. 225–244, John Wiley and Sons, 1979;.

* cited by examiner

Primary Examiner—Jayanti K. Patel
(74) Attorney, Agent, or Firm—Michael Zelenka

(57) ABSTRACT

A VHSIC hardware description language model is generated from a scanned image of an electronic circuit by: a. producing a bitmap image of a schematic using standard scanning devices that takes a paper drawing and produces an image of a drawing in electronic form where the white and black parts of the drawing image are represented by different values, for example, 0 representing white and 1 representing black; locating and identifying the text portions of the schematic which is used later to tag signal and pin names to reassemble hierarchical schematic drawing sets into models where the links between the various schematic drawings are included in the model; locating and identifying the drawing symbols, such as logic gates, transistors, and resistors, as well as the pins that link one schematic drawing to other schematics in a set of drawings, which is used to type each component in the schematic; locating and identifying the signals (or nets) which is a three stage process where the individual signal paths are located and identified, the inversion circles, which are critical to the correct identification of component function, are located and the ports (connections to signals) for each component are located and identified; integrating the information about component type, ports, inversion circles, and fanout (number of input ports driven by an output port) to uniquely identify each component; and combining the component information with the signal information to provide all of the information required to generate the netlist in the desired form (VHDL, Verilog, EDIF, or other).

7 Claims, 8 Drawing Sheets

```
        x
        x
        x
        x
xxxxxxxxxxxxxxxxxx
        x
        x
        x
        x
```

Fig. 5a
```
xxxx          x      x
----------------------------
     x        x      xxxxx
----------------------------
     x        x      x
----------------------------
     x        xxxxxxxx
```
Fig. 5b
```
     1111     2     3
----------------------------
         4     5    66666
----------------------------
         7     8     9
         a     bbbbbbbbb
```
Fig. 5c
```
1111     2i    3i
   1     2i    3i xxxxx
   1     2i    3i
   1     2ixxx 3i xxxxx
```
Fig. 5d
```
1111     2     2
   1     2     2 22222
   1     2     2
   1     22222222222
```
Fig. 5e
Flow 1
Fig. 5f
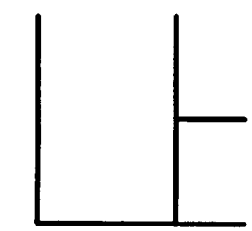
Flow2

Fig. 6a
```
xxxx      x    x
  x       x    xxxxx
  x       x    x
  x       xxxxxxxx
```
Fig. 6b
```
1111      2    3
-------------------------
  x       x    xxxxxx
  x       x    x
  x       xxxxxxxxxx
```
Fig. 6c
```
1111      2    3
   1      2    333333
-------------------------
   x      x    x
   x      xxxxxxxxxxx
```
Fig. 6d
```
1111      2    3
   1      2    333333
   1      2    3
-------------------------
   x      xxxxxxxxxxx
```
Fig. 6e
```
1111      2    3
   1      2    333333
   1      2    3
   1      2222222222
```
Fig. 6f
Fig. 6g
Flow 1
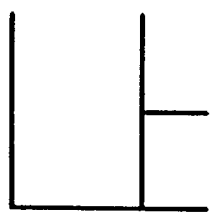
Fig. 6h
Flow2

```
entity FOUR_COUNTER is
  port(FLOW_2, FLOW_4, FLOW_3, FLOW_21: in bit; FLOW_12: inout bit; FLOW_44,
       FLOW_45, FLOW_43, FLOW_47: out bit ); end FOUR_COUNTER;

architecture STRUCTURE of FOUR_COUNTER is
  signal FLOW_5, FLOW_6, FLOW_7, FLOW_8, FLOW_9, FLOW_10, FLOW_11,
         FLOW_13, FLOW_14, FLOW_15, FLOW_16, FLOW_17, FLOW_18, FLOW_19,
         FLOW_20, FLOW_22, FLOW_23, FLOW_24, FLOW_25, FLOW_26, FLOW_27,
         FLOW_28, FLOW_29, FLOW_30, FLOW_31, FLOW_32, FLOW_33, FLOW_34,
         FLOW_35, FLOW_36, FLOW_37, FLOW_38, FLOW_39, FLOW_40, FLOW_41,
         FLOW_42, FLOW_46: bit;

component xnor_2_1
  port ( x1, x2: in bit; y1: out bit);
end component;

component and_2_1
  port ( x1, x2: in bit; y1: out bit);
end component;

component nor_2_1
  port ( x1, x2: in bit; y1: out bit);
end component;

component nand_3_1
  port ( x1, x2, x3: in bit; y1: out bit);
end component;

component nor_4_1
  port ( x1, x2, x3, x4: in bit; y1: out bit);
end component;

component inv_1_1
  port ( x1: in bit; y1: out bit);
end component;

component reg_3_2
  port ( x1, x2, x3: in bit; y1, y2: out bit);
end component;

begin
U1:  xnor_2_1 port map ( FLOW_5, FLOW_21, FLOW_38 );
U2:  and_2_1  port map ( FLOW_12, FLOW_7, FLOW_22 );
U3:  nor_2_1  port map ( FLOW_22, FLOW_24, FLOW_25 );
U4:  and_2_1  port map ( FLOW_25, FLOW_21, FLOW_20 );
U5:  xnor_2_1 port map ( FLOW_38, FLOW_6, FLOW_35 );
U6:  and_2_1  port map ( FLOW_10, FLOW_5, FLOW_20 );
U7:  and_2_1  port map ( FLOW_7, FLOW_4, FLOW_15 );
U8:  nand_2_1 port map ( FLOW_6, FLOW_5, FLOW_8 );
U9:  nor_3_1  port map ( FLOW_15, FLOW_13, FLOW_16, FLOW_26 );
U10: and_2_1  port map ( FLOW_10, FLOW_6, FLOW_13 );
U11: and_2_1  port map ( FLOW_24, FLOW_21, FLOW_28 );
U12: xnor_2_1 port map ( FLOW_24, FLOW_44, FLOW_36 );
U13: and_2_1  port map ( FLOW_10, FLOW_5, FLOW_16 );
U14: and_2_1  port map ( FLOW_7, FLOW_9, FLOW_17 );
U15: nand_3_1 port map ( FLOW_44, FLOW_6, FLOW_5, FLOW_9 );
U16: nor_4_1  port map ( FLOW_17, FLOW_14, FLOW_18, FLOW_19, FLOW_24 );
U17: nor_2_1  port map ( FLOW_17, FLOW_46, FLOW_14 );
U18: and_2_1  port map ( FLOW_24, FLOW_21, FLOW_29 );
U19: xnor_2_1 port map ( FLOW_29, FLOW_27, FLOW_37 );
U20: and_2_1  port map ( FLOW_10, FLOW_5, FLOW_18 );
U21: and_2_1  port map ( FLOW_7, FLOW_5, FLOW_19 );
U22: xnor_3_1 port map ( FLOW_33, FLOW_27, FLOW_46, FLOW_31 );
U23: nand_2_1 port map ( FLOW_31, FLOW_32, FLOW_41 );
U24: inv_1_1  port map ( FLOW_6, FLOW_5, FLOW_7, FLOW_33 );
U25: nand_3_1 port map ( FLOW_41, FLOW_42, FLOW_47 );
U26: nand_3_1 port map ( FLOW_27, FLOW_44, FLOW_42, FLOW_34 );
U27: nor_2_1  port map ( FLOW_34, FLOW_33, FLOW_40 );
U28: nand_3_1 port map ( FLOW_21, FLOW_7, FLOW_33 );
U29: inv_1_1  port map ( FLOW_2, FLOW_39 );
U30: inv_1_1  port map ( FLOW_4, FLOW_7 );
U31: inv_1_1  port map ( FLOW_3, FLOW_10 );
U32: inv_1_1  port map ( FLOW_21, FLOW_23 );
U33: inv_1_1  port map ( FLOW_44, FLOW_43 );
U34: reg_3_2  port map ( FLOW_39, FLOW_11, FLOW_12, FLOW_5 );
U35: reg_3_2  port map ( FLOW_38, FLOW_39, FLOW_11, FLOW_44, FLOW_6 );
U36: reg_3_2  port map ( FLOW_33, FLOW_39, FLOW_11, FLOW_45, FLOW_27 );
U37: reg_3_2  port map ( FLOW_39, FLOW_11, FLOW_44, FLOW_45, FLOW_27 );
U38: reg_3_2  port map ( FLOW_37, FLOW_39, FLOW_11, FLOW_43, FLOW_27 );
end STRUCTURE;
```

*Fig. 9*

METHOD FOR GENERATING COMPUTER AIDED DESIGN PROGRAMMING CIRCUIT DESIGNS FROM SCANNED IMAGES OF THE DESIGN

GOVERNMENT INTEREST

The invention described herein may be made, used, sold and/or licensed by, or on behalf of, the United States of America without the payment to us of any royalties thereon.

FIELD OF THE INVENTION

The present invention relates to the fields of electronic circuit design languages and pattern recognition software applications and more particularly, to the conversion of scanned images of schematic diagrams of electrical circuits into computer aided design programs/tools and/or VHSIC Hardware Description Language (VHDL) or similar electronic circuit description languages.

BACKGROUND OF THE INVENTION

Currently, the Department of Defense maintains a large inventory of documentation for electronic systems. Usually, this existing documentation is in the form of schematic drawings of electronic circuitry either in hard copy (paper or other similar media) or in a scanned image file. The term schematic drawing shall refer to a drawing that shows by means of graphic symbols, the electrical connections and functions of a specific circuit arrangement. In order to respecify or remanufacture these electronic circuits, as a part, board or system, a considerable amount of time and human effort is required to collect and understand the circuit information from the circuit drawing. Most of this time today is spent recreating the schematic drawing into a computer-aided design (CAD) software program or into a circuit description language. The ability to respecify and remanufacture electronic circuits is essential to the Department of Defense's and industry's ability to maintain and upgrade system electronics.

CAD programs put the information from the drawing into netlist formats. A netlist is a representation of a circuit in a form which lists a series of nets and shows the ports of which circuit are connected to each net. A net is a single electrical path in a circuit having the same signal value at all points wherein a single net can connect to multiple components. CAD programs use either a standard or a proprietary format to store netlist information about a circuit in a form that is generally easy to transfer to other CAD programs and is linked to situational models, which allow direct links between the design, modeling, simulation, and manufacturing phases of the circuit design.

In addition to the proprietary formats (generally used with a single software developer's CAD program), there are a number of standard formats for information exchange within and between different CAD developers. Though the details of these formats may differ, the basic information is the same: components and interconnections between the components. The VHDL is an industry and Department of Defense standard for the documentation, design and simulation of digital electronic circuitry. VHDL is a human and computer readable format used to import design information directly into CAD programs. (The other different types of circuit description languages exist, such as Verilog Hardware Description Language and the Electronic Design Interchange Format (EDIF), are similar to VHDL in concept, and are used for design transfer, but differ in other details which are not pertinent to this disclosure.) Most commercial CAD programs provide a fully automated and integrated manufacturing path from VHDL documentation to integrated circuit fabrication. Since VHDL provides manufacturing technology independent documentation of a digital integrated circuit, it is ideal for the purpose of documenting Department of Defense and industry digital electronic systems for system upgrades and full life cycle support.

Although scanned images of schematic drawings have been generally used in computerized document management systems, these scanned images have not been effectively used in CAD or electronic circuit description languages because these images lack the necessary format information concerning the components and interconnections that are required by these programs/languages. Although research has been conducted in recognizing scanned electronic circuit drawings, these efforts have primarily focused on symbol recognition and character extraction. See for example "Circuit Comparison by Hierarchical Pattern Matching," by Pelz et al, *Proceedings of* 1991 *Conference on Computer-Aided Design,* November 1991, Pp 290–293; "A New Input Method for CAD-Automatic Read In Technique Of Paper Drawings," by Shi et al, *Proceedings of* 1991 *International Conference on Circuits and Systems,* June 1991, pp 431–433; "Representation, Classification and Modelling of Graphs for Efficient Pattern Recognition in Line Images," by Maderlecher et al, *Proceedings of the $9^{th}$ International Conference on Pattern Recognition,* November 1988, vol. 2, pp. 678–680; and "A Knowledge-Based Graphic Description Tool for Understanding Engineering Drawings," by Yu et al, *Proceedings of the $1^{st}$ International Conference on Systems Integration,* April 1990, pp. 302–309. However, to date, there has been no publications or references to devices that extract circuit interconnections based on a full schematic understanding or a generation of a complete netlist representation from a scanned image. Accordingly, there is a need in this art to provide a complete bridge between scanned images of schematic drawings and the functional CAD or description language formats of the schematic drawings.

The present invention addresses such a need.

SUMMARY OF THE INVENTION

Accordingly, it is a general object of the present invention to provide a method of converting scanned images of schematic drawings into a functional netlist which can be used in either a CAD program or in a description language of an electronic circuit such as VHDL.

It is another objective of this invention to provide a means to not only recognize elements and sub elements of electronic circuit, but also to recognize the connectivity and signal flow between the circuit elements and subelements.

These and other objectives are accomplished by the following generic steps:

a. producing a bitmap image of a schematic using standard scanning devices that takes a paper drawing and produces an image of a drawing in electronic form where the white and black parts of the drawing image are represented by different values, for example, 0 representing white and 1 representing black;

b. locating and identifying the text portions of the schematic which is used later to tag signal and pin names to reassemble hierarchical schematic drawing sets into models where the links between the various schematic drawings are included in the model;

c. locating and identifying the drawing symbols, such as logic gates, transistors, and resistors, as well as the pins that link one schematic drawing to other schematics in a set of drawings;

d. locating and identifying the signals (or nets) wherein the individual signal paths are located and identified, the inversion circles, which are critical to the correct identification of component function, are located and the ports (connections to signals) for each component are located and identified;

e. integrating the information about component type, ports, inversion circles, and fanouts (number of input ports driven by an output port) to uniquely identify each component; and f. combining the component information with the signal information to provide all of the information required to generate the netlist in the desired form (VHDL, Verilog, EDIF, or other).

Specifically, after the image is in an electronic format, symbol recognition software and algorithms, which are known to those skilled in the art, are used to identify the various components of the schematic. Then, the signal flow of the schematic is recognized by three independent steps: 1) detecting all signal crossovers; 2) exploring contiguous blocks and assigning all signal crossovers an appropriate pseudo-contiguous block identification; and 3) extracting the signal images from the contiguous blocks using the methods of the present invention. The location and identification of the contiguous signal blocks can be accomplished according to the present invention in one or a combination of several ways. One method involves finding the contiguous blocks one after another and then searching over the entire scanned bitmap. In the other methods, the bitmap is divided into small "pages" and the search for the contiguous blocks is done either in a peer-to-peer fashion concurrently or it is done in a hierarchical fashion sequentially.

Once the appropriate contiguous blocks are located and identified, appropriate portions of the signal cross overs are given either a pseudo-contiguous identification, i.e. an identification other than the two symbols used in the bitmap, or a contiguous identification, i.e. a identification used to symbolize a solid line. After finding all contiguous and pseudo-contiguous blocks, signals can be recognized by investigating special features of the signal image. The image of the signal is a contiguous block which has a regular pixel width and is attached to at least two electronic symbols. Since the components and signals have been located and identified, and since the signals only connect to components at the ends of the signal image, only the area where signals and components connect needs to be investigated to locate and identify the ports of a component. Accordingly, there is a port (a connection between the signal and the component) only where black pixels from a signal image are contiguous to pixels from a component image.

Because inversion circles are only found at ports, or the places where the signals and components meet in a schematic drawing, and because inversion circles are very small, they are difficult to detect reliably when distinguishing between component images, for example, when distinguishing between a NAND gate and an AND gate. However, inversion circles are easily recognized features when compared to the signal image. Accordingly, it is preferred that the inversion circles are located and identified at this point in the signal flow recognition process.

Once all the information is extracted from the schematic drawing, the information is assembled to produce an output representation of the schematic drawing in a CAD form. Then, the extracted and assembled information is placed into netlists in an electronic circuit design language.

BRIEF DESCRIPTION OF THE DRAWINGS

These and other features of the invention will be better understood in light of the following Detailed Description of the Invention and the attached drawings wherein:

FIGS. 5a–f illustrate a submethod of identifying signal flow according to one method of the present invention wherein FIGS. 5a–d show the method and wherein FIGS. 5e and 5f illustrate the actual signal flow represented in a schematic drawing;

FIGS. 6a–h illustrate a submethod of identifying signal flow according to another method of the present invention wherein FIGS. 5a–f show the method and wherein FIGS. 6g and 6h illustrate the actual signal flow represented in a schematic drawing;

FIG. 9 is a sample of VHDL code generated from the schematic drawing of FIG. 2 according to the present invention.

DETAILED DESCRIPTION OF THE INVENTION

Figure 1:
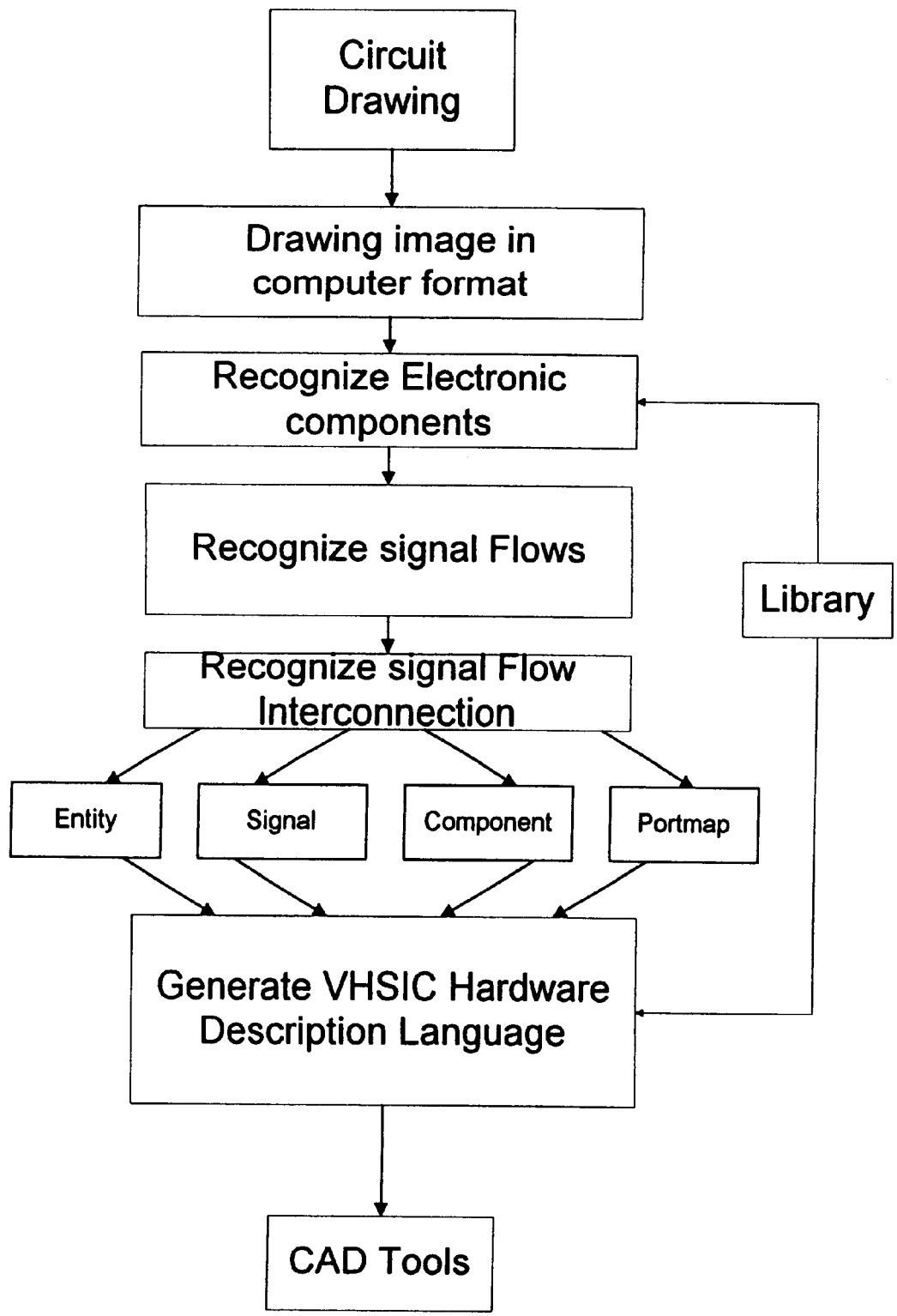
FIG. 1 is a flow diagram of the generic method according to the present invention.

Now referring to FIG. 1, there is shown a flow diagram of the generic method of the present invention. Specifically, the first general step of the present invention is to produce a bitmap image of a schematic using standard scanning devices that takes a paper drawing and produces an image of a drawing in electronic form where the white and black parts of the drawing image are represented by different values, for example, 0 representing white and 1 representing black. Next, the text portions of the schematic, which are used later to tag signal and pin names to reassemble hierarchical schematic drawing sets into models, are located and identified by the use of algorithms and software which are known to those skilled in the art. As well, the drawing symbols, such as logic gates, transistors, and resistors, as well as the pins that link one schematic drawing to other schematics in a set of drawings, are also located and identified by using methods known to those skilled in the art. One such known method is described in U.S. Pat. No. 5,222,158, issued to Takasaki et al on Jun. 22, 1993.

The next and most important step of the present invention is to locate and identify the signals (or nets) of the electrical circuit. This is a three stage process where the individual signal paths are located and identified; the inversion circles, which are critical to the correct identification of component function, are located; and the ports (connections to signals) for each component are located and identified. Then, the information about component type, ports, inversion circles, and fanouts (number of input ports driven by an output port)

to uniquely identify each component are processed and identified. Lastly, the component information with the signal information is combined to provide all of the information required to generate the netlist in the desired form (VHDL, Verilog, EDIF, or other such language).

These steps will be explained more fully as follows. In order to obtain a computer readable format, a scanner is used to digitize a drawing of an electric circuit, such as that illustrated in FIG. 2, and create an image file. Then, the image file, in hexadecimal code, is converted to a black and white bitmap where each binary bit presents a pixel with two states either "1" (black) or "0" (white). As those skilled in the art will readily know, although the image of circuit drawing can be displayed on a computer screen from the bitmap, there is no design information present. The bitmap is merely a graphical format and the image on the screen is a copy of the circuit drawing. Therefore, the bitmap image at this point simply is nothing more than an image.

Component Recognition and Marking

However, after processing this simple image to search for the electronic symbols contained therein, such as AND, NAND, OR, NOR and inverters, the image can then be used to form a signal flow diagram according to the present invention. The various symbols, such as those illustrated in FIG. 3 (an AND or OR gate), in the image file are recognized by matching patterns from a library of known symbols. A sample pattern may be obtained from the scanned drawing, for example, an OR gate in the library may be created by highlighting and cropping the symbol and then storing in it the library. Typically, the symbols are identified by known pattern recognition software and algorithms known in the art. Briefly though, a simple library sample may be used to match the pixels in the image bitmap. Those pixels in the image bitmap that closely fit the sample are chosen to be candidates for further investigation. Usually, because of the existence of image noise, no exact match is expected and only the best fit will be considered as a successful candidate. The best fit is chosen by algorithms known in the art. For the OR gate example, there are only a finite number of OR symbols in the electric circuit, all of which are located at different sites. Therefore, during the library sample matching, not only does the best fit at each site need to be chosen and granted an identification number, but also in the preferred embodiment of the present invention, the component symbols of the gate must also be identified. The component symbols are constructed from a base component symbol, that is the input, output signal connections and potential inversion circles need to identified within each component symbol. Of course, the component symbols can also be identified and located as a complete symbol as well each of which would represent a unique component type (i.e. the base component type, inversion circles, and input and output ports can all be identified at the same time).

Figure 3:
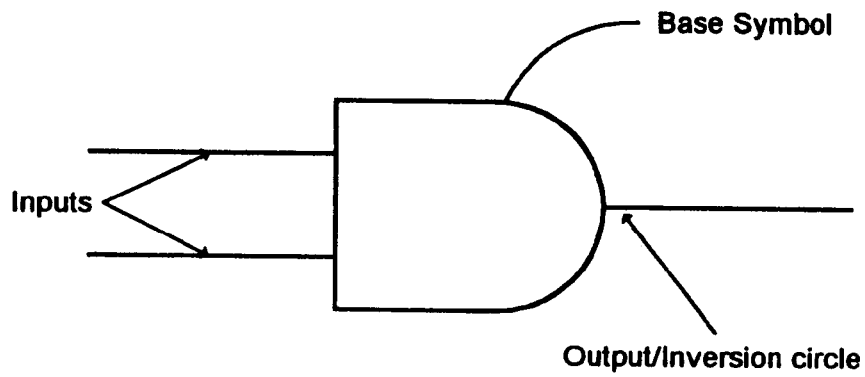
FIG. 3 is a typical depiction of a standard gate used in drawing schematics of electrical circuitry.

However, to avoid unnecessarily using a time-consuming library matching system over the whole bitmap, a quick screening may also be used according to the present invention to predict where the drawing symbols are probably located. Screening is not necessary for the white pixels since they are not a part of drawing and can be easily ignored. This cursory screening step would only look for special features (partial symbols) rather than looking for complete drawing symbols. For example, finding an arc in the bitmap will be good enough to indicate the presence of an AND or an OR gate, as shown in FIG. 3. Since the arc carries the most important information, but consists of many fewer pixels than the complete AND or OR gate symbols, the search effort is considerably reduced. Furthermore, drawing symbols possessing same, or similar, features can be searched for together to reduce the processing time. A good example is the symbols, AND, NAND, OR, NOR, and XNOR, all of which have a similar arc. The purpose of screening is to locate the xy coordinates of look-alike patterns which may be a candidate of the desired drawing symbol. The next step after this screening process will only examine a sub-bitmap of all look-alike patterns, which is obviously much smaller than an entire library of symbols.

Various pattern recognition algorithms can be used in recognizing the drawing symbol in this sub-bitmap. These algorithms, as stated before, are known in the art and need not be discussed in detail here. However, a straight forward way to recognize a drawing pattern is to match the pattern with the look-up tables in a reference library. In the 4-bit counter case, since the look-alike patterns in the sub-bitmap are either AND, NAND, OR, NOR, or XNOR, the recognition at this stage is simply classifying and numbering the sub-bitmaps. This can be done in an even easier way by examining the pixel density of the look-alike patterns rather than using the look-up tables. Briefly, the symbol of an OR can be separated from an AND or XNOR by simply comparing the pixel density of the input side (front) of a like-like pattern, and an NOR (or an NAND)) is identified from an OR (or an AND) by checking the pixel density of the output side (back) of a look-like pattern.

After a drawing symbol is located, the input and output pins can be recognized by studying the pixel density and black pixels surrounding the drawing symbol. The order of pins is numbered from top to bottom for both input and outputs. However, the relation between the pins and signals is not completed until after the signal flow information is compiled in the next step.

The goal of this recognition step is to place the unique functions represented by each drawing symbol as well as the relationship and relative positions of/between the drawing symbols into a code or database structure which can be read by a computer and accompanying software. Thus, the circuit information, such as the type, the xy coordinate, and the pin layout of a drawing symbol are essential in later analysis and they are stored in a database in a format such as that found below.

| Type | X | Y | Type | X | Y |
|------|-----|-----|------|-----|-----|
| XNOR | 635 | 74 | ANN | 326 | 673 |
| AND | 399 | 218 | AND | 326 | 721 |
| NOR | 499 | 254 | NOR | 604 | 743 |
| AND | 578 | 266 | NAND | 754 | 791 |
| XNOR | 634 | 278 | NOR | 604 | 803 |
| AND | 399 | 279 | NAND | 895 | 815 |
| AND | 327 | 398 | NAND | 612 | 863 |
| NAND | 183 | 411 | NOR | 746 | 898 |
| NOR | 499 | 445 | NAND | 611 | 911 |
| AND | 326 | 446 | INV | 231 | 124 |
| AND | 577 | 457 | INV | 303 | 171 |
| XNOR | 634 | 469 | INV | 160 | 219 |
| AND | 327 | 494 | INV | 231 | 219 |
| AND | 326 | 578 | INV | 505 | 731 |
| NAND | 183 | 589 | INV | 836 | 827 |
| NOR | 498 | 624 | FIFO | 814 | 32 |
| AND | 326 | 625 | FIFO | 813 | 236 |
| AND | 577 | 636 | FIFO | 813 | 428 |
| XNOR | 634 | 648 | FIFO | 812 | 607 |

Signal Recognition and Signal Image Generation

To recognize signal images, four steps are used according to the present invention. The first is to detect all signal crossovers and bridge the broken pixels blocks at the crossover to ensure that the black pixels in a signal image are always contiguous. The second is to explore all contiguous blocks and set block numbers. The third is to extract signal images from contiguous blocks and assign signal IDs to them and the fourth is to build a signal database.

Since the white pixels and the black pixels of the symbols have no contribution to the signal image, they are ignored for purposes of this portion of the present method. For a small sized image bitmap, the signals can be recognized one after another by tracking the contiguous black pixels within the entire bitmap. However, for a large sized bitmap, paging is useful to divide the bitmap to small pieces, and the search for the contiguous blocks is conducted in pages (small size bitmaps). In brief, the contiguous block search for the paged bitmap, starting from the first page, is conducted as follows: (1) find and number the contiguous blocks; and (2) pass the block numbers to the next page, and repeat step (1) until the last page is reached. In each step, only block numbers from the previous page are needed for the current page contiguous block search. The only special cases are: if a block in the current page does not receive a number from the previous page (not adjacent to any block in the last page), then a new number will be automatically assigned (initialize a new block); and if a block in the current page receives two or more numbers from the previous page (adjacent to two or more blocks in the previous page), then those numbers are automatically combined into one (alias numbers).

With the pages and page numbers appropriately assigned, the signal crossovers are investigated and analyzed. Signal crossovers are frequently observed in schematic drawings and are the most difficult portion of the schematic to analyze and incorporate in a VHDL. According to the present invention, a unique method of identifying and marking the signal crossovers is used to overcome this difficult problem.

Although there is no regular image pattern that can be followed for the signal image, the image of a signal (i.e. a combination of lines) does have attributes that can be identified, such as, it consists of adjacent black pixels (a contiguous block), it is in a fixed width, and it is attached to electronic symbols. With this then, a rule based system is used according to the present invention to analyze these attributes.

Figures 4A, 4B:
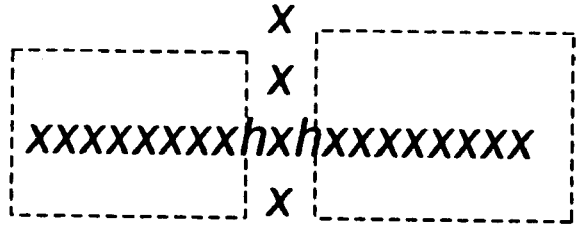
FIGS. 4a and 4b are details of a signal cross-over in an electrical circuit schematic format and the same electrical circuit coded according to the present invention.

The rule based system according to the present invention starts with the lemma that the pixels of a signal are in a contiguous block, assuming that there is no signal crossover. For a crossover situation, however, the pixels of one signal image are assumed to be in a contiguous block and the pixels of the other signal are assigned to be in a pseudo-contiguous block. As shown in FIG. 4a, unidentified black pixels are initially represented with an "x" and the crossover has only one pixel contiguous block. Thus, the initial lemma does not apply. To remedy this, the x's in the vertical line and the x's in the horizontal line are required to be separated in two blocks rather than in one contiguous block. In other words, one of the two signals in the crossover must be cut and linked by other means across the other. Therefore, the present method assigns one portion of the initial contiguous block a pseudo-contiguous block. A pseudo-contiguous block consists of two or more contiguous blocks which are linked via points. First, points represented by "h's" ar used to break the horizontal line into two pieces, as shown in FIG. 4b. This is done to insure that the x's in the horizontal line and the x's in the vertical line are not in the same contiguous block. Second, the two horizontal blocks are linked (reconnecting the broken signal) so that each signal has its own pixel block. Since the x's in the linked block are not geographically adjacent, the term pseudo-contiguous has been used for purposes of clarity.

For simplicity of detecting signal crossovers so as to apply the pseudo-contiguous notation to a crossover portion, a sample matching technique may be used as described in the symbol recognition description above. In order to further detect the signal flow however, the total number and location of each signal crossover needs to be calculated and stored. To accomplish this task three different methods may be employed.

For a relatively simple circuit drawing, a queuing tree algorithm may be applied wherein the contiguous blocks are formed one after another by collecting the adjacent black pixels in the whole bitmap. Then starting from a root pixel in a block, all adjacent black pixels (branches) are identified. Next, the leaves (adjacent black pixels) of each branch are identified. This propagation process continues until all the unidentified black pixels in the block are found. Finally, a number is assigned to the block and the next block in the queue is processed until all contiguous blocks are located.

For more complicated drawings, the paging method as described above is used to divide the bitmap into small pages and the search for contiguous blocks is conducted page by page. After processing all the pages, the contiguous blocks found in each page must be assembled together. A simple example of this method is illustrated in FIGS. 5a–e. FIG. 5a illustrates the signal flow drawings of FIGS. 5e and 5f wherein an "x" is used to represent the unidentified black pixels. In FIG. 5b, this bitmap is divided into four pages, as represented by the dashed lines, and contiguous blocks are found in each page and numbered from '1' to 'b', representing eleven different contiguous blocks. Then, the blocks are scanned vertically reading between pages (as represented by the vertical dashed lines) and all contiguous vertical blocks are identified and reassigned the appropriate number as shown in FIG. 5c. For example, blocks '1', '4', '7' and 'a' are found to be contiguous so that they are combined into block '1'. The procedure is then used in finding the combined blocks '2' and '3' and the contiguous blocks are subsequently reassigned again until the bitmap looks like FIG. 5d which is an accurate depiction of the original image file as illustrated in FIGS. 5e and 5f. Those skilled in the art will appreciated that by using this method, the exploration of contiguous blocks can be processed independently and concurrently.

Although the simple page method described above favors a contiguous block search, a large page number may overload storage and may be costly in assembling the pages. An alternative method is based on the idea of a Markov (memoryless) process, which is described in such treatises as Luenberger, *Introduction to Dynamics Systems*, pp. 225–244, John Wiley and Sons, 1979. Briefly, this method assumes that the past has no influence of the future if the present is specified. Using this premise, all contiguous blocks are found on the first page and each is numbered. Then, in going to the next page, the block number is passed on to the next page and all contiguous blocks are found and numbered starting from this block number. This procedure is used for all the remaining pages. In each step, only the block numbers from the previous page are needed for the current page contiguous block search and therefore, no page assembling is needed. If a block in the current page does not receive a number from the previous page (not adjacent to any block from the previous page), then a new number is automatically assigned. Furthermore, if a block in the current page receives two or more numbers from the previous page, then those numbers are automatically combined into one. To use an analogy, this process is similar to a family tree diagram where two efforts are made. The first effort is to find all brother and sister pixels to form a contiguous block. The second is to inherit the family name (block number) to the next generation. Those efforts are then performed from generation to generation until all family members are found and every pixel has a family name. Clearly, only the previous generation is needed to inherit the family names. FIGS. 6a–h illustrate a simple example of how this method is used in the present invention. As shown, the same two signal flow illustrations are used, as represented by FIGS. 6g and 6h. Similar to FIG. 5a, the signal flow drawings of FIGS. 6g and 6h is illustrated in a bitmap form where an "x" is used to represent the unidentified black pixels. A single page is formed and the contiguous blocks are identified and numbered with unique identification numbers. As shown in FIG. 6b, each of the contiguous blocks is given a unique number '1', '2', and '3'. Then, second, third and fourth pages are formed over the entire bitmap and the identification numbers of contiguous blocks '1', '2' and '3' are continued (inherited) to contiguous blocks of each of the three contiguous blocks of the first page, as shown in FIGS. 6c–e. In the final step, those two sets of contiguous blocks, '2' and '3', which themselves are contiguous, are reassigned a single identification number, '2'. This is shown in FIG. 6f as the completed bitmap.

Figure 10:
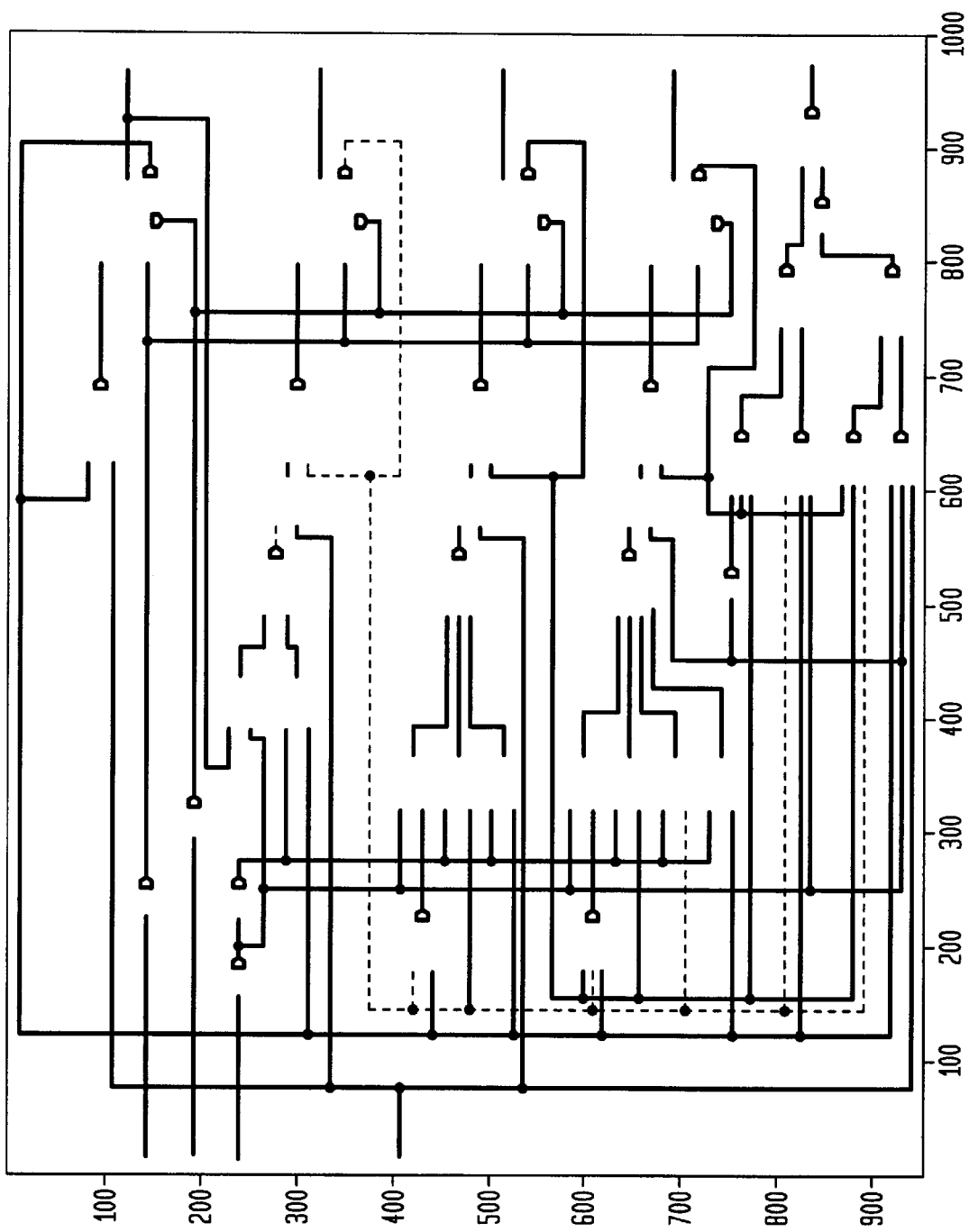
FIG. 10 is a signal image of the schematic drawing of FIG. 2 generated according to the present invention.

After finding all contiguous blocks and pseudo-contiguous blocks using any of the methods set forth above, the signals can be recognized by investigating the special features of the signal image. This can be done by first assuming that the image of a signal is the contiguous block which has a regular pixel width and which is attached to at least two electronic components. From this, the recognized individual signal images can be compared to original bitmap and the different signal images can be uniquely identified, either by color or some other automatic notation, and separated from one another, as shown in FIG. 10. At crossovers, signals are separated into two parts between horizontal lines (i.e. there is no signal flow conflict), but both parts have the same color which indicates that there is no signal flow termination. This is the result of the pseudo-contiguous identification process discussed above.

Since the components and signals have been located and identified, and since the signals only connect to components at the ends of the signal image, only the area where signals and components connect needs to be investigated to locate and identify the ports of a component. Accordingly, there is a port (a connection between the signal and the component) only where black pixels from a signal image are contiguous to pixels from a component image.

Figure 8:
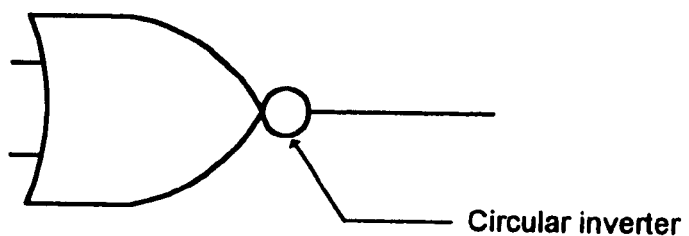
FIG. 8 is a schematic illustration of a circular inverter.

Because inversion circles are only found at ports, or the places where the signals and components meet in a schematic drawing, and because inversion circles are very small, they are difficult to detect reliably when distinguishing between component images, for example, when distinguishing between a NAND gate and an AND gate. However, inversion circles are easily recognized features when compared to the signal image. Accordingly, it is preferred that the inversion circles are located and identified at this point in the signal flow recognition process. An example of a gate with an inversion circle is shown in FIG. 8.

Figure 7:
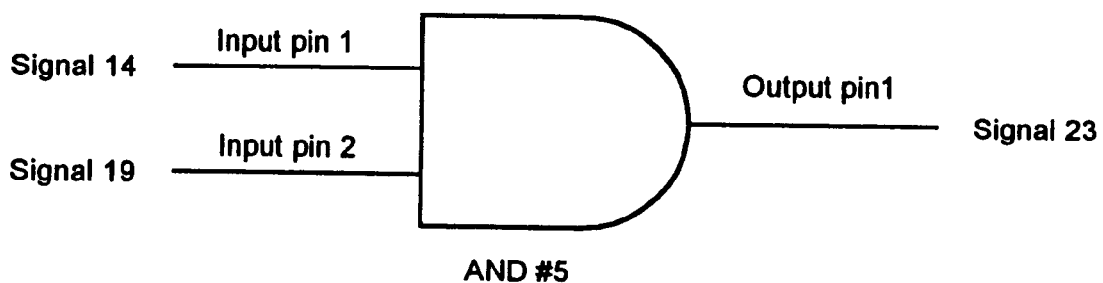
FIG. 7 is another schematic illustration of a typical gate configuration wherein the specific pins of the gate are identified according to the present invention.

Once all the information is extracted from the schematic drawing, the information is assembled to produce an output representation of the schematic drawing in a CAD form. Then, the extracted and assembled information is placed into netlists in an electronic circuit design language. First, the interconnections between drawing symbols are then recognized by investigating the pin-to-pin relations and associating the pin ID numbers with the signal ID numbers. An example of this identification system is illustrated schematically in FIG. 7 wherein signals 14 and 19 are associated with the input pins 1 and 2, respectively, of AND gate #5 and wherein output signal 23 is associated with output pin 1 of AND gate #5. A matrix is formed to track the relationship of the components' IDs, Pin IDs, signal IDs, pin-to-signal relations, I/O types, and component types.

From this point, those skilled in art will be able to convert the information extracted into a netlist, which will generally have a listing of the input and output pins (or ports), a listing of the signals, a listing of the components used in the netlist, and a notation for representing the connections among the components, the signals, and the netlist's input and output pins. In order to develop the signal images and the component recognition data collected thus far, there are four basic elements essential to generating the VHDL model. These are entity, signal, component and portmap, as shown in the general flow diagram of FIG. 1. In the entity statement, information about I/O pads and signal flow is required. In the signal statement, all internal signals are listed. In the component statement, the component information, names, and input and output pins are listed. In the portmap statement, a table of pin-to-pin connections of all components is necessary.

Figure 2:
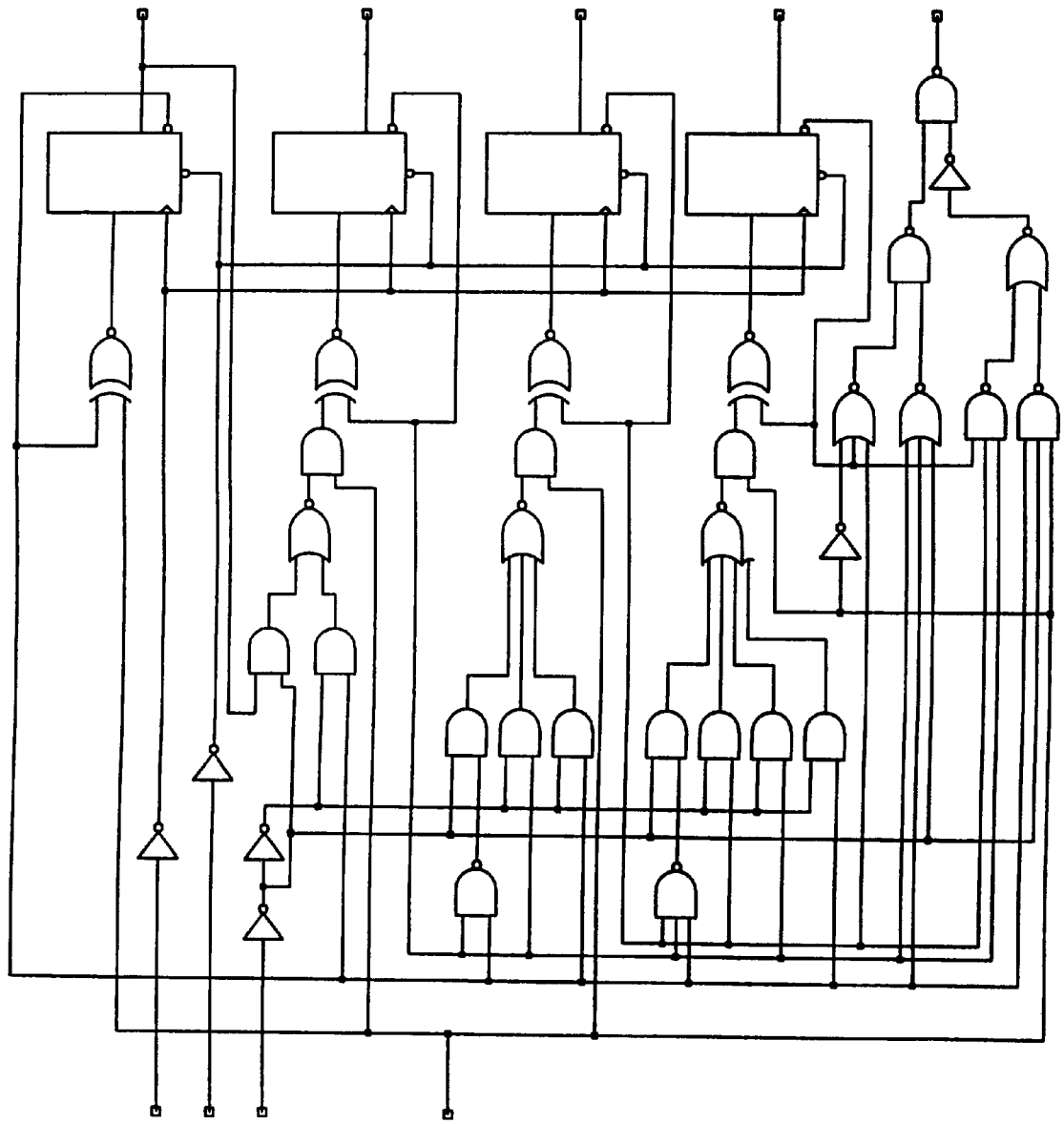
FIG. 2 is a schematic drawing of a typical electrical circuit for which the present invention can convert the scanned image of this circuit into a VHDL.

In a VHDL netlist, for example, an entity representing the entire schematic drawing is created. This section also contains the connections (or I/O ports) between the entity and other outside circuitry. The port or pin names recognized above are used as the names to identify the various ports, or automatically generated names can also be used. The use of the recognized port names can also be used to automate the process of assembling a hierarchical netlist from a set of hierarchical schematic drawings. An architecture section declares the signals that are used internally to the netlist to connect the components. The component statements (declarations) are used to identify all of the components used in the VHDL netlist. An instantiation sections calls out individual instances (or items) used in the netlist, and also indicated how the component ports are interconnected. Other netlist formats have the same essential elements and are constructed in a similar fashion. An example of the VHDL model generated from the scanned image of FIG. 2 is shown in FIG. 9 wherein the entity statements are given in the top left corner, the signal statements are given next directly under the entity statements, component statements are given thereafter, and portmap statements are given on the right side of the page.

From the description set forth above, one skilled in the art would be able to develop any number of different computer programs to generate the appropriate component information database, signal image information database, and netlists and therefore, a specific code listing for this invention is not necessary for those skilled in the practice this invention.

Although the present invention has been described with regard to a single method according to the present invention, those skilled in the art will readily recognize that other variations of performing this method are also possible. Accordingly, the inventors do not wish to be limited by the present specification, but only by the appended claims.

What is claimed is:

1. A method for automatically generating a non-pictorial description of an electronic circuit from a pictorial schematic image thereof by scanning said pictorial schematic image so as to obtain data comprising a non-pictorial description of the pictorial schematic image and processing that data in such a manner as to obtain the non-pictorial description of the electronic circuit, wherein such non-pictorial description of the electronic circuit comprises an identification and listing of the circuit's components, the input and output terminals of those components, and all interconnections among those input and output terminals.

2. The method of claim 1 wherein the manner of processing the data comprising the non-pictorial description of the pictorial schematic image includes, as one step, identifying the circuit's electronic components through the recognition of identifying characteristics found in that data and further includes the step of storing information about those components, hereinafter referred to as component data.

3. The method of claim 2 wherein the manner of processing the data comprising the non-pictorial description of the pictorial schematic image further includes the step of temporarily eliminating from further consideration that subset of such data related to the identified electronic components so as to more easily enable the recognition of other identifying characteristics, including those associated with inversion circles.

4. The method of claim 3 wherein the manner of processing the data comprising the non-pictorial description of the pictorial schematic image further includes the step of the identification of data related to inversion circles through the recognition of identifying characteristics found in that data, and still further includes the step of storing information about those inversion circles, hereinafter referred to as inversion circle data.

5. The method of claim 4 wherein the manner of processing that data comprising the non-pictorial description of the pictorial schematic image further includes the step of identifying that subset of data related to signal paths through the recognition of identifying characteristics found in that data, and further includes the step of storing information about those signal paths, hereinafter referred to as signal path data.

6. The method of claim 5 wherein the manner of processing that data comprising the non-pictorial description of the pictorial schematic image further includes the steps of locating all signal crossovers through the recognition of identifying characteristics in that data, and still further includes the step of storing information about those crossovers, hereinafter referred to as crossover data.

7. The method of claim 6 wherein the stored component data, inversion circle data, signal path data and crossover data are correlated so as to provide said non-pictorial description of the electronic circuit.

* * * * *